(12) United States Patent
Leitner et al.

(10) Patent No.: US 10,320,350 B1
(45) Date of Patent: Jun. 11, 2019

(54) SYSTEM AND METHOD FOR BYPASSING A LOW NOISE AMPLIFIER

(71) Applicant: Infineon Technologies AG, Neubiberg (DE)

(72) Inventors: Thomas Leitner, Pregarten (AT); Daniel Schroegendorfer, Linz (AT); Hans-Dieter Wohlmuth, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/937,163

(22) Filed: Mar. 27, 2018

(51) Int. Cl.
*H03F 1/12* (2006.01)
*H03F 3/72* (2006.01)
*H03F 3/195* (2006.01)

(52) U.S. Cl.
CPC ............. *H03F 3/72* (2013.01); *H03F 3/195* (2013.01); *H03F 2200/294* (2013.01); *H03F 2200/451* (2013.01); *H03F 2203/7239* (2013.01)

(58) Field of Classification Search
CPC .............................. H03F 1/12; H03F 3/45892
USPC ...................................................... 330/51, 9
See application file for complete search history.

(56) References Cited

U.S. PATENT DOCUMENTS

| | | | | |
|---|---|---|---|---|
| 6,265,935 B1 * | 7/2001 | Kaneda | ................. | H03F 1/0277 330/133 |
| 6,271,722 B1 * | 8/2001 | Ballantyne | ............ | H03F 1/0205 330/151 |
| 6,346,854 B1 * | 2/2002 | Heithoff | .................. | H03F 1/305 330/149 |
| 8,149,050 B2 * | 4/2012 | Cabanillas | ............ | H03F 1/0277 330/302 |
| 8,351,882 B2 * | 1/2013 | Harel | ........................ | H03F 3/24 330/302 |
| 2011/0115565 A1 * | 5/2011 | Cabanillas | ............ | H03F 1/0277 330/307 |

* cited by examiner

Primary Examiner — Henry Choe
(74) Attorney, Agent, or Firm — Slater Matsil, LLP

(57) ABSTRACT

In accordance with an embodiment, a radio frequency (RF) amplifier circuit includes a switchable capacitance circuit having a first terminal configured to be coupled to an input matching inductor. The switchable capacitance circuit is configured to provide a short circuit between the first and second terminals in a first state, and provide a first capacitive impedance between the first and second terminals in a second state. The RF amplifier also includes a low noise amplifier (LNA) having an input terminal coupled to the second terminal of the switchable capacitance circuit; and a bypass switch coupled to an output of the LNA, the second terminal of the switchable capacitance circuit, and an output of the RF amplifier circuit. The bypass switch is configured to select the output of LNA in the first state, and select the second terminal of the switchable capacitance circuit in the second state.

9 Claims, 8 Drawing Sheets

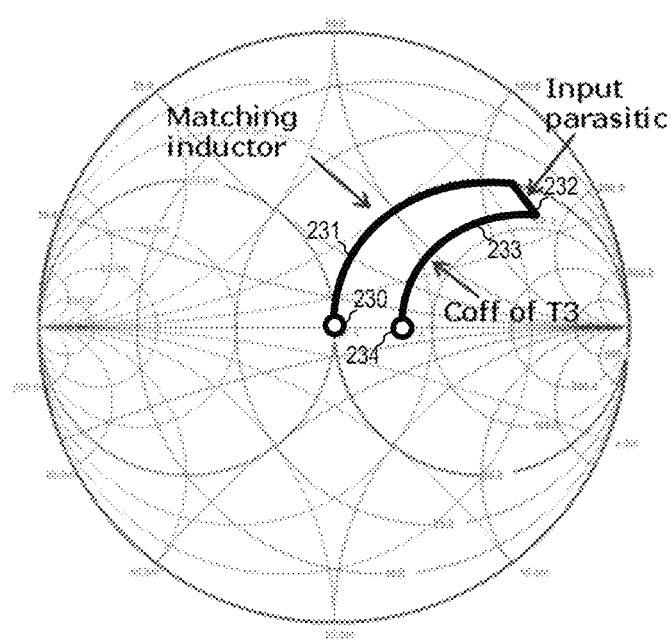
*Fig. 2D*
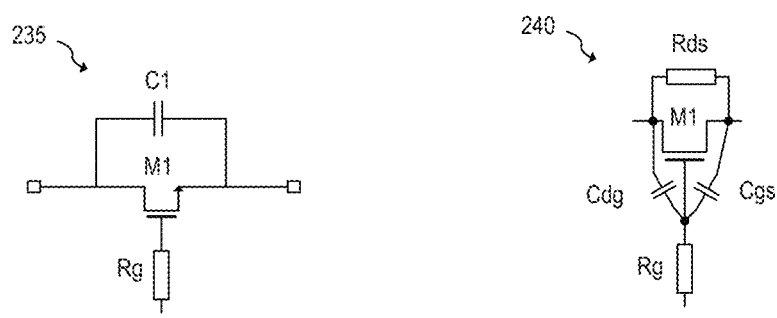
*Fig. 2E*  *Fig. 2F*

| Control Signal | LNA Mode | Bypass Mode |
|---|---|---|
| S3 | H | L |
| S4 | L | H |
| S5 | L | H |
| S6 | L | H |
| S7 | H | L |
| S8 | H | H |
| S9 | H | L |

SYSTEM AND METHOD FOR BYPASSING A LOW NOISE AMPLIFIER

TECHNICAL FIELD

The present invention relates generally to a system and method, and, in particular embodiments, to a system and method for bypassing a low noise amplifier (LNA).

BACKGROUND

Electronic devices used with wireless communication systems, such as cellular phones, GPS receivers, and Wi-Fi enabled notebook and tablet computers, generally contain signal processing systems that have interfaces to the analog world. Such interfaces may include wire line and wireless receivers that receive transmitted power and convert the received power to an analog or digital signal that may be demodulated using analog or digital signal processing techniques. A typical wireless receiver architecture includes a low noise amplifier (LNA) that amplifies the very small signals that may be received by an antenna and passes an amplified signal to later amplification and/or signal processing stages. By providing gain at the LNA, subsequent gain processing stages are made less sensitive to noise, thereby enabling a lower system noise figure.

In some signal environments, however, the received RF signal may vary over a few orders of magnitude depending on the relative locations of the transmitter and receiver and depending on the amount of power being transmitted. When a mobile device is in close proximity with a transmitting device, the received RF power may be strong enough to saturate an LNA that is configured to amplify weak signals. To address this situation, some RF systems support a "linearity on demand" feature in which the gain of the LNA is decreased to accommodate the increased received signal power. In some systems, the LNA itself may be bypassed to increase system linearity. However, the practical implementation of "linearity on demand" features poses challenges with respect to maintaining an adequate system noise figure and RF match.

SUMMARY

In accordance with an embodiment, a radio frequency (RF) amplifier circuit includes a switchable capacitance circuit having a first terminal configured to be coupled to an input matching inductor. The switchable capacitance circuit is configured to provide a short circuit between the first and second terminals in a first state, and provide a first capacitive impedance between the first and second terminals in a second state. The RF amplifier also includes a low noise amplifier (LNA) having an input terminal coupled to the second terminal of the switchable capacitance circuit; and a bypass switch coupled to an output of the LNA, the second terminal of the switchable capacitance circuit, and an output of the RF amplifier circuit. The bypass switch is configured to select the output of LNA in the first state, and select the second terminal of the switchable capacitance circuit in the second state.

In accordance with a further embodiment, a radio frequency (RF) system includes: an integrated circuit having a low noise amplifier (LNA), a first transistor, a first switch and a second switch. The first transistor has a load path coupled between an input of the LNA and an input pad of the integrated circuit, where the load path has a low impedance when the integrated circuit is in a first state and a first capacitive impedance when the integrated circuit is in a second state. The first capacitance impedance is configured to provide an RF match when the integrated circuit is in the second state. The first switch is coupled between an output of the LNA and an output pad of the integrated circuit, and the first switch configured to be on when the integrated circuit is in the first state and off when the integrated circuit is in the second state. The second switch is coupled between the input of the LNA and the output pad of the integrated circuit, and the second switch configured to be off when the integrated circuit is in the first state and on when the integrated circuit is in the second state.

A method of operating a low noise amplifier (LNA) include bypassing the LNA by receiving an RF signal via an input matching inductor, coupling a first capacitance in series with the input matching inductor, and providing the received RF signal to an output terminal via a bypass switch having a first input connected to the input of the LNA and an output coupled to the output terminal. The method also includes operating the LNA by receiving the RF signal via an input matching inductor, bypassing the first capacitance, amplifying the RF signal using the LNA, and providing the amplified RF signal to the output terminal via the bypass switch having a second input connected to the output of the LNA and an output coupled to the output terminal.

BRIEF DESCRIPTION OF THE DRAWINGS

For a more complete understanding of the present invention, and the advantages thereof, reference is now made to the following descriptions taken in conjunction with the accompanying drawings, in which:

FIG. 2D illustrates a Smith chart showing how the output impedance of the embodiment LNA system is affected by various system components in the bypass mode, and FIGS. 2E and 2F illustrate embodiment switchable capacitance circuits;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The present invention will be described with respect to preferred embodiments in a specific context, a system and method for bypassing an LNA at the front end of a wireless communications system. Embodiments of the invention may also be applied to other RF-based systems including, but not limited to radar systems, and high frequency wireline communications systems.

In embodiments of the present invention, the input of an LNA is matched using a series inductor when the LNA is active. When the LNA is bypassed, an RF match at the output of the bypassed LNA is maintained by inserting a matching capacitance in series with the series inductor. This added series capacitance compensates for the inductance of the series inductor, thereby providing an RF match when the input of the LNA is coupled to the output of the amplifier circuit via a bypass switch. In some embodiments, the series inductor is provided off-chip, while the matching capacitance is provided on-chip. Advantages of embodiments of the present invention include the ability to achieve a good RF match of a bypassed LNA without adding a significant number of switching and matching components, and without appreciably increasing the system noise figure.

Figure 1A:
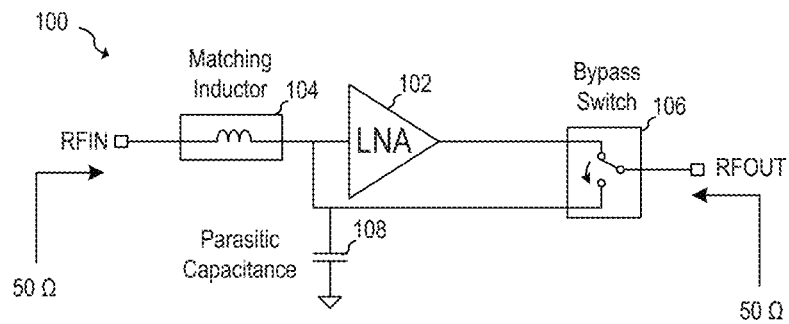
FIG. 1A illustrates an exemplary LNA system.

FIG. 1A illustrates an exemplary amplification system 100 that includes LNA 102 having an input terminal coupled to input terminal RFIN via matching inductor 104 and an output terminal coupled to output terminal RFOUT via bypass switch 106. Matching inductor 104 is typically implemented off chip in order to ensure a high quality factor and provide better noise performance. During normal operation when LNA 102 is configured to amplify signals received at input terminal RFIN, bypass switch 106 is set such that the output of LNA 102 is connected to output terminal RFOUT. However, when LNA 102 is bypassed, such as when high amplitude RF signals are being received or high linearity is needed, bypass switch 106 connects the input of LNA 102 to output terminal RFOUT and disconnects the output of LNA 102 from output terminal RFOUT. Bypassing LNA 102 in this manner, however, significantly changes the impedance seen at input terminal RFIN. For example, if matching inductor 104 is configured to provide a good RF match to LNA 102 while LNA 102 is active, the act of connecting output terminal RFOUT to the input of LNA 102 increases the reflection coefficient at RFOUT. This increase in reflection coefficient is exacerbated by the presence of parasitic capacitance 108.

Figure 1B:
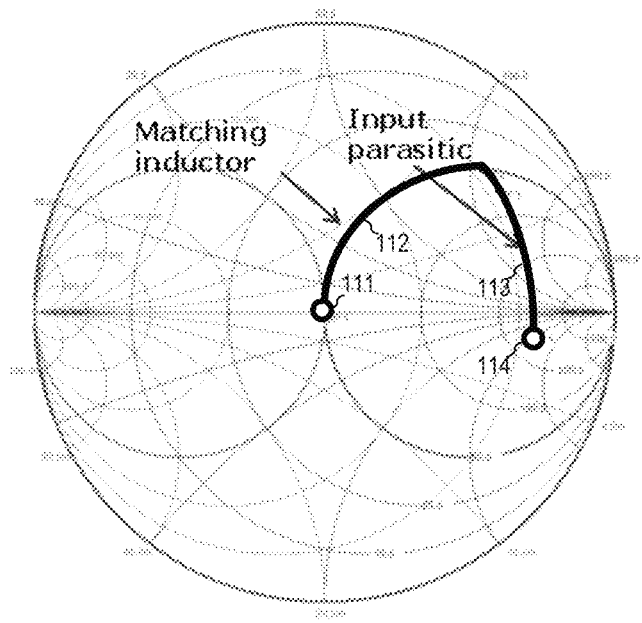
FIG. 1B illustrates a Smith chart showing how the output impedance of the LNA system is affected by various system components in the bypass mode.

FIG. 1B illustrates a Smith chart plot that shoes the effect of matching inductor 104 and parasitic capacitance 108 on the impedance seen at output node RFOUT when bypass switch 106 connects terminal RFOUT to the input of LNA 102. Point 111 represents a matched input impedance condition at input terminal RFIN, and line segment 112 represents the effect of matching inductor 104 on the input impedance. Thus, matching inductor 104 transforms the matched impedance into an inductive impedance. Parasitic capacitance 108 transforms the inductive impedance created by matching inductor 104 into a slightly capacitive impedance as is represented in the Smith chart by line segment 113 and point 114, which approximates the output impedance of system 100. Providing a 50 ohm output match from point 114 on the Smith chart could be achieved by an additional matching network between the input of LNA 102 and bypass switch 106. For example, point 114 could be transformed back to 111 on the Smith chart by using a shunt inductor followed by a series capacitor, or a shunt capacitor followed by a series inductor. If both of these possibilities were implemented on-chip, additional chip area would be used, and additional RF losses would be generated due to the limited quality factor of on-chip inductors.

In embodiments of the present invention, the effect of parasitic capacitance 108 is reduced in the bypass mode by compensating matching inductor 104 with a series capacitor. The combination of the matching inductor 104 and a series capacitor forms a series resonant circuit that counteracts the effects of parasitic capacitance 108 and provides a matched output at output terminal RFOUT when LNA 102 is bypassed.

Figure 2A:
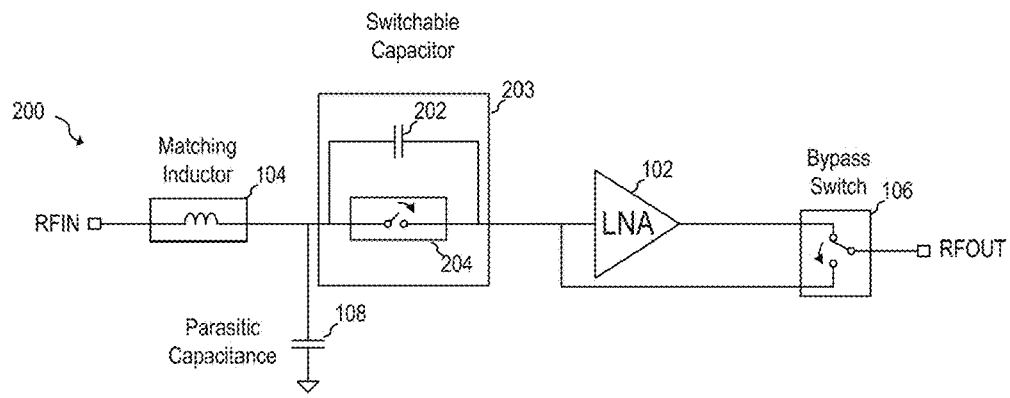
FIGS. 2A, 2B and 2C illustrate schematic diagrams of an embodiment LNA system.

FIG. 2A illustrates an embodiment amplification system 200 that includes LNA 102 having an input coupled to input terminal RFIN via matching inductor 104 and an output coupled to output terminal RFOUT via bypass switch 106. Embodiment amplification system 200 is similar to amplification system 100 shown in FIG. 1A with the addition of switchable capacitance circuit 203 represented by capacitor 202 coupled in parallel with switch 204. During normal operation when LNA 102 is configured to amplify signals received at input terminal RFIN, bypass switch 106 is set such that the output of LNA 102 is connected to output terminal RFOUT and switch 204 of switchable capacitor is closed, which effectively short circuits capacitor 202. When the received RF signal has a high amplitude or high linearity is needed, bypass switch 106 connects the input of LNA 102 to output terminal RFOUT and disconnects the output of LNA 102 from output terminal RFOUT. During this bypass mode, switch 204 of switchable capacitance circuit 203 is opened, which effectively couples capacitor 202 in series with matching inductor 104.

In various embodiments, switch 204 is implemented using a low ohmic and low capacitive device, such as an MOS transistor or PIN diode. In some embodiments, LNA 102 is biased in an active state when it is being used for amplification, and powered down when LNA 102 is bypassed.

LNA 102 may be implemented using RF LNA circuits and systems known in the art. In one specific embodiment, LNA 102 is implemented using an NMOS transistor with a source degeneration inductor. Alternatively other structures and device technologies could be used. For example, LNA 102 could be implemented using Bipolar, BiCMOS, pHEMT or other process technologies.

Figure 2B:
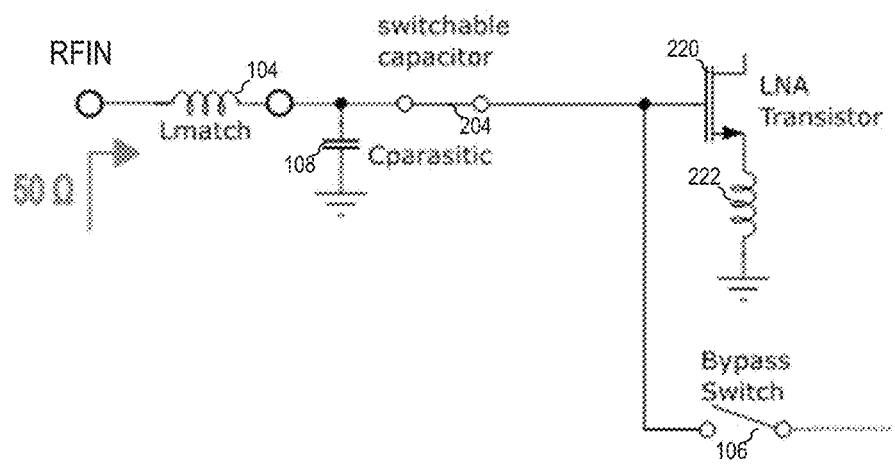
Figure 2C:
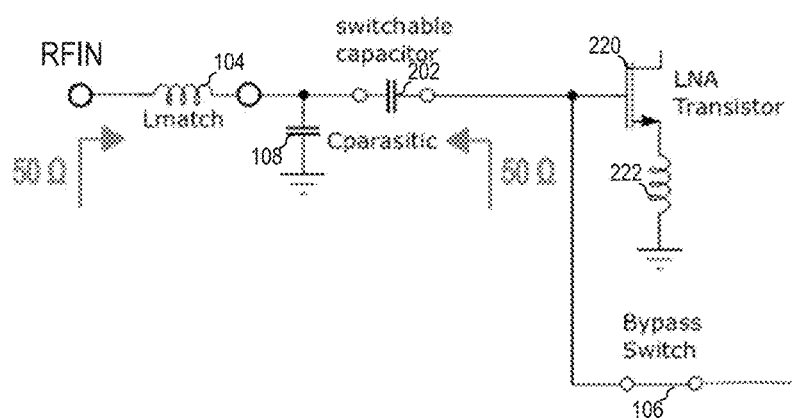

FIGS. 2B and 2C show equivalent circuits that illustrate the topology of amplification system 200 in each mode: FIG. 2B illustrates the functionality of amplification system 200 when LNA 102, which is represented by LNA transistor 220 and degeneration inductor 222, is active, and FIG. 2C illustrates the functionality of amplification system 200 when LNA 102 is bypassed. As shown in FIG. 2B, the gate of LNA transistor 220 is connected to node RFIN via matching inductor 104 and closed switch 204. Bypass switch 1o6 is shown as being open. In this case, the value of matching inductor 104 is set to provide an RF match to the gate of LNA transistor 220.

As shown in FIG. 2C, bypass switch 1o6, which is shown as being closed, is coupled to node RFIN via matching inductor 104, and series capacitor 202. In some embodiments, the bias current to LNA transistor 220 is turned-off in order to save power.

FIG. 2D illustrates a Smith chart plot that demonstrates the effect of matching inductor 104, parasitic capacitance 1o8 and series capacitor 202 on the output impedance seen by closed bypass switch 1o6 in the topology of FIG. 2C. Point 230 represents a matched input impedance condition at input terminal RFIN, and line segment 231 represents the effect of matching inductor 104 on the impedance. Thus, as represented by are segment 231, matching inductor 104 transforms the matched impedance into an inductive impedance. Parasitic capacitance 1o8 shifts the inductive impedance created by matching inductor 104 to a higher impedance as represented on the Smith chart by line segment 232. Series capacitor 202, however, shifts the impedance closer to the origin of the Smith chart as represented by line segment 233 and point 234. While the matched condition represented by point 234 does not lie directly on the origin of the Smith chart as does point 230, an adequate RF output match can be achieved without using additional and bulky matching components in some embodiments. In one specific example, an input and output return loss of 10 dB and an insertion loss of between about 1 dB and about 2.5 dB is achieved depending on frequency. However, return losses greater than or less than 10 dB and insertion losses outside of the range of 1 dB to 2.5 dB may also be achievable depending on the specific implementation.

FIG. 2E illustrates switchable capacitor circuit 235 that may be used, for example, to implement switchable capacitance circuit 203 shown in FIG. 2A. As shown, switchable capacitor circuit 235 includes NMOS transistor M1 coupled in parallel C1 and gate resistor Rg coupled in series with the gate of NMOS transistor M1. The resistance of gate resistor Rg is selected to be high enough to ensure that the parasitic gate-drain and gate-source capacitances of transistor M1 appear as series connected capacitances to prevent parasitic loading when transistor M1 is turned-off. This parasitic loading may attenuate signals that are intended to pass through capacitor C1. Capacitance C1 may be implemented, for example using a separate capacitor, such as a metal capacitor, metal-insulator-metal (MIM) capacitor or other capacitor structures known in the art. In alternative embodiments, transistor M1 may be implemented using FET transistors in a CMOS-Bulk, CMOS-SOI using thin or thick film silicon on insulator (SOI), GaAs-HEMTs, or other FET transistor type technology. In some cases, PIN Diodes may also be used.

In some embodiments, the parasitic capacitances of transistor M1 can be used as capacitance C1, as illustrated in FIG. 2F with respect to switchable capacitance circuit 240. Here, there series combination of gate-drain capacitance Cdg and gate-source capacitance Cgs function as the series capacitance when transistor M1 is turned-off. Resistor Rds is provided to ensure that the source and drain of transistor M1 (or a plurality of transistors coupled in series) is biased when in the off-state, and the resistance of Rds may be made high enough to avoid resistive power losses. In some embodiments, the resistance of resistor Rds may be between about 50 kΩ and about 5 MΩ; however, resistances outside of this range may be used depending on the particular system and its specifications.

In some embodiments, the value of resistor Rg is high enough such that the voltage division provided by parasitic capacitances Cdg and Cgs closely approximates an ideal capacitive voltage divider at the system's frequency of operation. In various embodiments, the value of resistor RF is also determined by switching time requirements. For example, the time constant τ of the RC circuit formed by resistor Rg and parasitic capacitances Cdg and Cgs is τ=(Cdg+Cgs)*Rg. Since the values of parasitic capacitances Cdg and Cgs are defined by the width of transistor M1, the value of Rg can be made to be dependent on the width of transistor M1. In various embodiments the value of resistor Rg may be between about 10 kΩ and 5 MΩ; however, resistances outside of this range may be used depending on the particular system and its specifications.

Figure 3A:
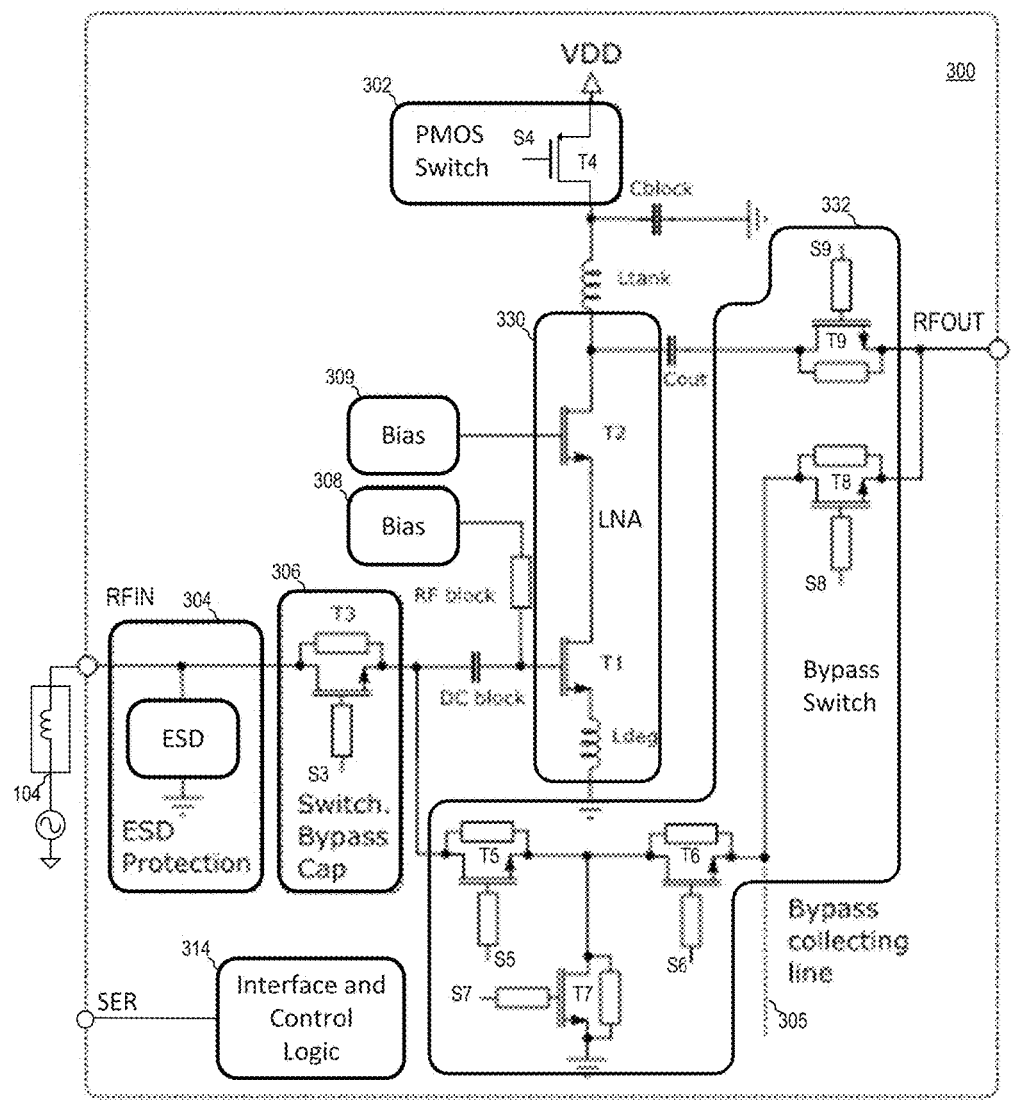
FIG. 3A illustrates a schematic of an embodiment LNA integrated circuit.

FIG. 3A illustrates an example embodiment LNA integrated circuit 300 that includes a signal path that spans from input pin RFIN to output pin RFOUT. The primary signal path of integrated circuit includes ESD protection circuit 304, switchable capacitance circuit 306, LNA 330, and bypass switch 332. As shown, matching inductor 104 is external to LNA integrated circuit 300 and is coupled to input pin RFIN. In alternative embodiments of the present invention, matching inductor 104 may be implemented on-chip.

Bypass switch 332, which includes transistors T5, T6, T7, T8 and T9, is configured to route the output of LNA 330 to output pin RFOUT by turning-on transistor T9 when LNA 330 is active during an "LNA mode." During the LNA mode, transistors T5, T6 and T8 that connect the input of LNA 330 to output pin RFOUT are turned-off. When LNA 330 is bypassed in a "bypass mode," the input of LNA 330 transistor is coupled to output pin RF out by turning-on transistors T5, T6 and T8 and turning-off transistor T9. As shown, transistors T5, T6 and T7 form a T-switch that provides extra isolation between the input of LNA 330 and output pin RFOUT. Thus, in the LNA mode when transistors T5 and T6 are turned-off, transistor T7 is turned-on in order to ground the common node between transistors T5 and T6. In the bypass mode when transistors T5 and T6 are turned-on to form a signal path between the input of LNA 330 and output pin RFOUT, transistor T7 is turned-off. In some embodiments, multiple instances of embodiment LNAs may be coupled together via bypass collecting line 305 in order to implement a multi-input LNA, such as LNA integrated circuit 410 described with respect to FIG. 4B below.

As shown, switchable capacitance circuit 306 is implemented using transistor T3. During the LNA mode, transistor T3 is turned on to provide a low impedance path between input pin RFIN and the input of LNA 330o. During the bypass mode, transistor T3 is turned off, and the parasitic gate-drain and gate-source capacitances of transistor T3 form a series capacitance, as described above with respect to switchable capacitance circuit 240 in FIG. 2F. In alternative embodiments, this series capacitance may also be implemented using an additional capacitor as depicted in FIG. 2E. As is also explained above, this series capacitance forms a series resonant circuit with matching inductor 104 that helps provide a better RF match at output pin RFOUT. In various embodiments switchable capacitance circuit 306 is configured to produce a series capacitance between about 400 fF and about 800 fF when transistor T3 is turned off. This capacitance range corresponds to a transistor device with a width of between about 1 mm and about 2 mm. In alternative embodiments, capacitance values and transistor widths outside of these ranges may also be used depending on the specific implementation and its specifications.

In some embodiments, the on resistance Ron of transistor T3 is made low enough to have a low impact on the noise figure of LNA integrated circuit 300 when operating in the LNA mode. For example, in some embodiments, a transistor width larger than 1 mm causes a noise figure increase of less than, 0.05 dB. It should be appreciated that the example of a 1 mm transistor width is just one specific example. The actual transistor width implemented in an embodiment system may be adjusted according to the particular noise figure requirements of the implemented system.

In the depicted embodiment, LNA 330 includes NMOS transistor T1, degeneration inductor Ldeg coupled to the source of NMOS transistor T1, and NMOS transistor T2. NMOS transistor T1 is used as an input transistor and NMOS transistor T2 is used as a cascode transistor. Degeneration inductor Ldeg may either be implemented on-chip or off-chip and external to LNA integrated circuit 300. During the LNA mode, NMOS transistor T1 and cascode NMOS transistor T2 are biased via bias generation circuits 308 and 309, which may be implemented, for example, using LNA bias generation circuits known in the art. Current may be provided to LNA 330 from VDD via PMOS switch circuit 302 and inductor Ltank. During the bypass mode, LNA 330 may be shut down by reducing the bias voltage produced by bias generators 308 and 309 and by turning off PMOS transistor T4 of PMOS switch circuit T4.

As is further shown in FIG. 3A, the input of LNA 330 is coupled to the switchable capacitance circuit 306 via a DC blocking capacitor, and the output of LNA 330 is coupled to output pin RFOUT via output capacitor Cout and transistor T9 of bypass switch 332. The values of inductor Ltank and capacitor Cout may be adjusted to provide an output match to LNA 330. In some embodiments, additional matching components and/or different output matching structures may be used to match the output of LNA 330.

ESD protection circuit 304 may be included to provide protection to various components of LNA integrated circuit 300 that are coupled to input pin RFIN. In some embodiments, the capacitance of ESD protection circuit 304 is made as low as possible while maintaining a specified ESD performance. ESD protection circuit 304 may be implemented using ESD protection circuits known in the art.

Figures 3B, 3C:
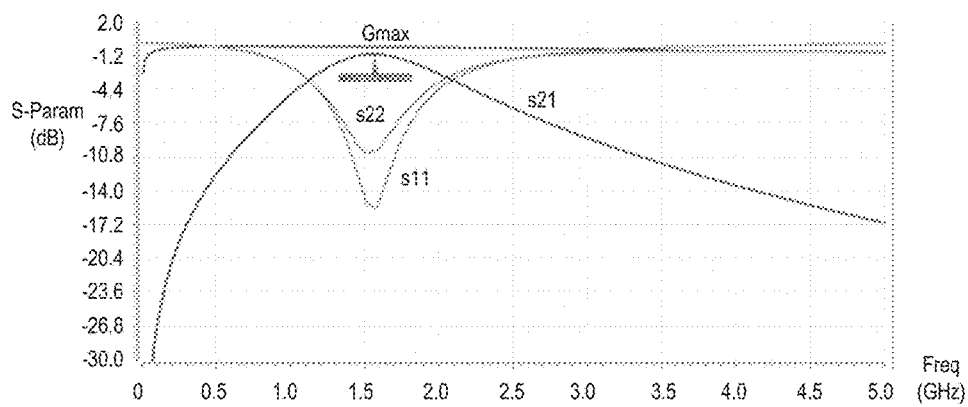
FIG. 3B illustrates a table showing the relationship between selected operation modes and control signals of the embodiment LNA integrated circuit.
FIG. 3C illustrates an s-parameter plot of the embodiment LNA integrated circuit.

In an embodiment, the operation mode of LNA integrated circuit 300 may be selected by providing a digital control signal via interface pin SER to interface and control logic 314 that controls the on and off state of transistors T3, T4, T5, T6, T7, T8 and T9, via control signals S3, S4, S5, S6, S7, S8 and S9. FIG. 3B illustrates a table that shows the relationship between the LNA mode and the state of control signals S3, S4, S5, S6, S7, S8 and S9. For control signals S3, S5, S6, S7, S8 and S9 a high state H designates a voltage that is sufficient to turn-on respective NMOS transistors T3, T5, T6, T7, T8 and T9 and a low state L designates a voltage that is sufficient to turn-off respective NMOS transistors T3, T5, T6, T7, T8 and T9. Since transistor T4 is a PMOS device, a high state H for control signal S4 turns-off transistor T4 and a low state L turns-on transistor T4.

Interface and control logic 314 may also control the state of bias generators 308 and 309 that set the amount of bias current conducted by LNA 330o. In various embodiments, interface and control logic 314 may be implemented using a parallel digital interface and/or a series digital interface such as an SPI, IIC, RFFE or other serial interface standard. In such embodiments, interface and control logic 314 also includes the appropriate digital interface circuitry, as well as decoding logic that places the various transistors and adjustable components on LNA integrated circuit 300 in their appropriate state based on the date received by interface and control logic 314. In alternative embodiments of the present invention, non-standard digital interfaces may be used.

LNA integrated circuit 300 may be configured to operate at a variety of center frequencies, for example, between about 600 MHz and about 3.5 GHz, however, center frequencies outside of this range may also be possible depending on the particular embodiment and its specifications. It should be understood that LNA integrated circuit 300 is just one of many possible embodiment implementations. In alternative embodiments of the present invention, other topologies and variations may be used without departing from the spirit of the disclosed embodiments.

FIG. 3C illustrates a graph showing the s-parameter performance of LNA integrated circuit 300 configured to operate at 1.5 GHz while configured in the bypass mode. As shown, the insertion loss (s21) is less than 1.5 dB, the input return loss (s11) is greater than 14 dB, and the output return loss (s22) is greater than 10 dB. It should be understood that the performance shown in FIG. 3B is just one of many examples of embodiment system performance.

Figure 3D:
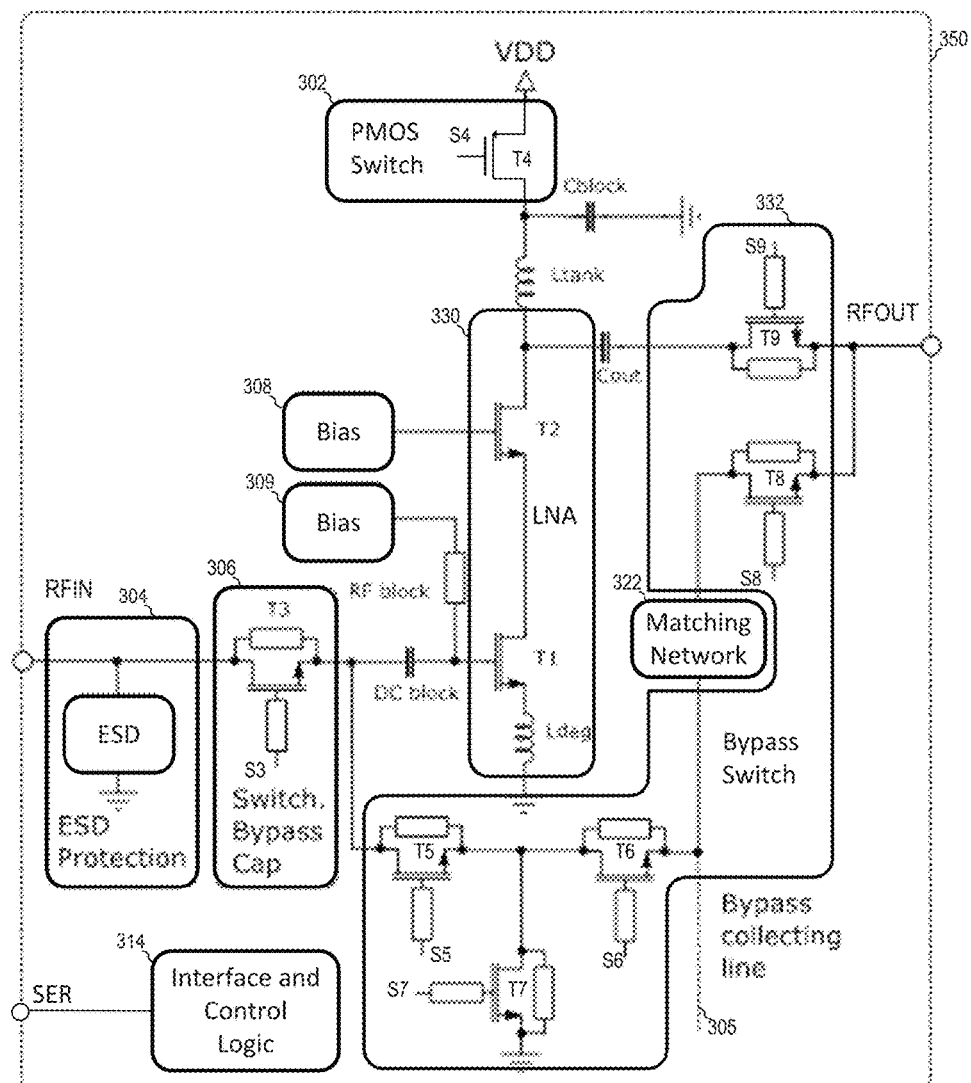
FIG. 3D illustrates a schematic of an LNA integrated circuit according to a further embodiment.

In many embodiments, such as the embodiment depicted in FIG. 3A, it is not necessary to add additional on-chip matching components and directly bypass LNA 330 using LNA bypass switch 332. However, in some cases, an additional matching network 322 may be coupled between the input of LNA 330 and output pin RFOUT as shown in FIG. 3D that illustrates LNA integrated circuit 350 according to an alternative embodiment of the present invention. Matching network 322 may be used, for example, in systems that have high output return loss requirements and/or in systems that have input parasitics at pin RFIN that require extra compensation to achieve an adequate RF match. As shown in FIG. 3D, matching network 322 coupled between transistor T6 and transistor T8 of bypass switch 332. In alternative embodiments, matching network 322 may be coupled at other portions of the circuit.

Figure 3E:
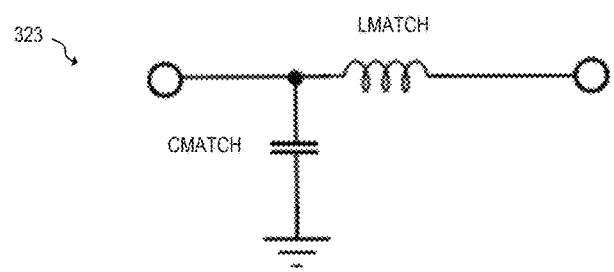
FIG. 3E illustrates an embodiment LC matching network.

FIG. 3E illustrates an LC matching network 323 that can be used to implement matching network 322 shown in FIG. 3D. As shown, the LC matching network 323 includes a shunt capacitor CMATCH and a series inductor LMATCH. It should be understood that LC matching network 323 is just one example of many possible matching network topologies that may be used in embodiments of the present invention. In alternative embodiments, other matching network topologies known in the art may be used.

Figure 4A:
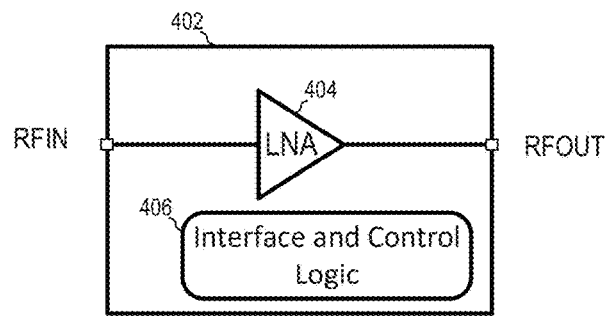
FIGS. 4A and 4B illustrate block diagrams of embodiment LNA integrated circuits.
Figure 4B:
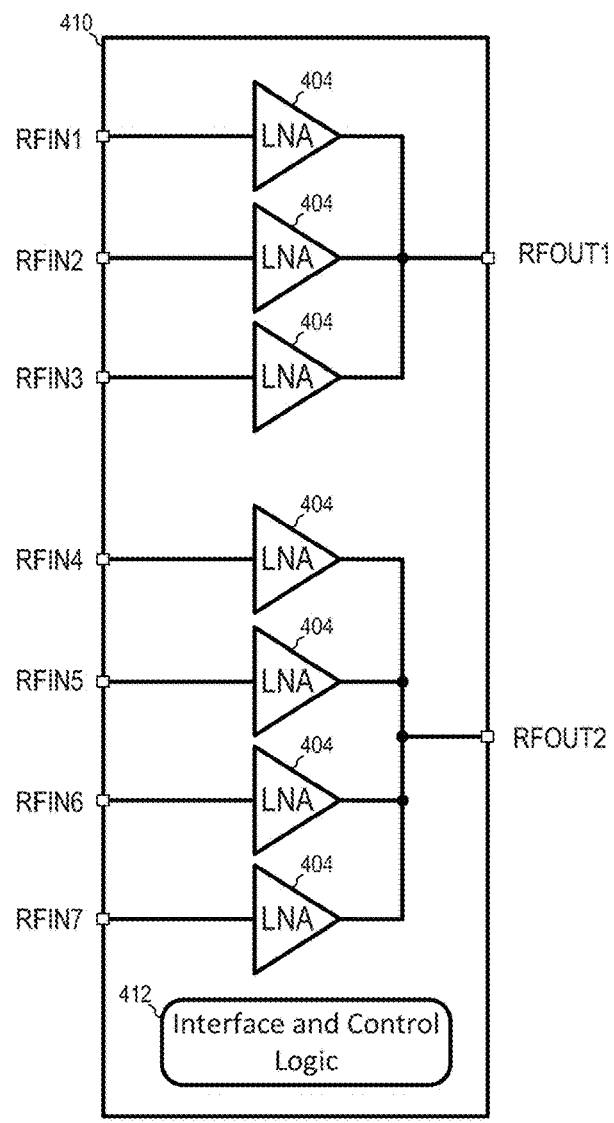

FIGS. 4A and 4B illustrate additional integrated circuit configurations for embodiment LNA integrated circuits. FIG. 4A illustrates a block diagram of LNA integrated circuit 402 that includes a single LNA 404 and interface and control logic block 406. LNA 404 may contain bypass circuitry and a switchable capacitance circuit as described with respect to the embodiments above. In some embodiments, LNA integrated circuit 402 may be configured and implemented in a similar fashion as the embodiment LNA integrated circuits 300 and 350 depicted in FIGS. 3A and 3C, respectively.

FIG. 4B illustrates a block diagram of LNA integrated circuit 410 that includes multiple LNAs 404 and interface and control logic block 412. LNAs 404 may each contain bypass circuitry and a switchable capacitance circuit as described with respect to the embodiments above. In various embodiments, LNA integrated circuit 410 may be used to support systems, such a multiple standard systems that include multiple antennas and multiple signal paths. One example of such a system is a smartphone or tablet computer that supports multiple telecommunication standards such as code division multiple access (CDMA), Global System for Mobile Communications (GSM), Long Term Evolution (LTE), and the like. In addition, the particular wireless device may also support IEEE 801.11 Wi-Fi operation and Global Positioning System (GSM).

As shown, LNAs 404 contains inputs coupled to inputs RFIN1, RFIN2 and RFIN3 and outputs coupled to a single output pin RFOUT1. Similarly, LNAs 404 includes inputs coupled to inputs RFIN4, RFIN5, RFIN6 and RFIN7 and outputs coupled to a single output pin RFOUT2.

The control of the selection and bypassing of each of LNAs 404 may be controlled by interface and control logic block 412. It should be appreciated that the configuration of LNA integrated circuit 410 is just one of many possible examples of embodiment LNA integrated circuits that include multiple LNA circuits. In alternative embodiments of the present invention, greater or fewer than seven LNAs may be used, and partitioning of the shared output pins may be different depending on the specifics of the particular system.

Figure 5:
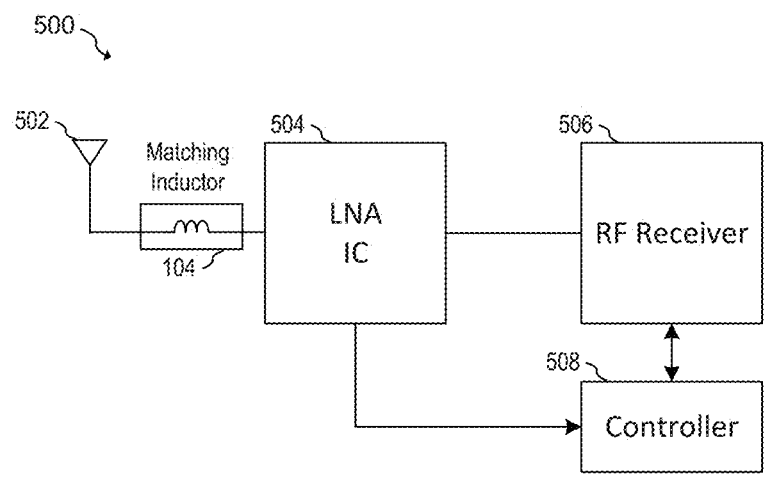
FIG. 5 illustrates an RF system that utilizes an embodiment LNA integrated circuit.

FIG. 5 illustrates RF system 500 according to an embodiment of the present invention. As shown, RF system 600 includes antenna 502 coupled to RF receiver 506 via embodiment LNA integrated circuit 504, which may be implemented at least according to any of the embodiments described herein. In the illustrated embodiment, matching inductor 104 is shown external to LNA integrated circuit 504; however, matching inductor 104 may be implemented on LNA integrated circuit 504 in some embodiments. Bypass controller 508 is configured to provide mode selection data to LNA integrated circuit 504 based on input from RF receiver 506 or other controller. For example, when RF receiver 506 detects that the input signal from antenna 502 is at a high level, it may instruct bypass controller 508 to select the bypass mode.

Figure 6:
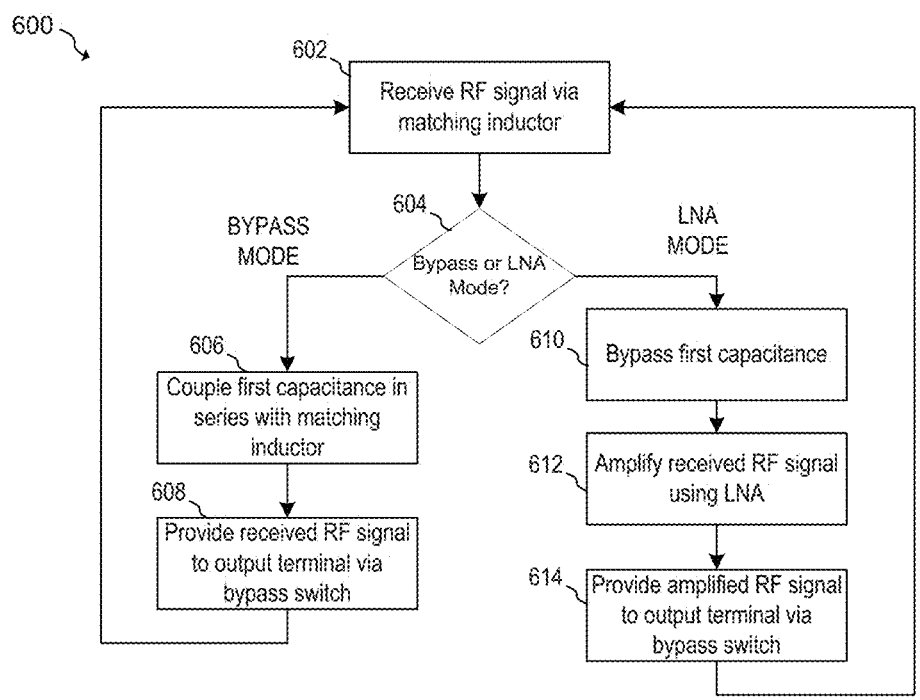
FIG. 6 illustrates an embodiment method of operating an LNA.

FIG. 6 illustrates an embodiment method of operating an LNA. In step 602, which occurs concurrently with all other steps, an RF signal is received via a matching inductor. In step 604, a decision is made whether to operate the LNA in an LNA mode in which the LNA actively amplifies the received RF signal, or to operate the LNA in a bypass mode in which the LNA is bypassed. This decision may be made, for example, according to a measured amplitude of the received RF signal. In one embodiment, the LNA mode is selected when the amplitude of the received RF signal is low and the bypass mode is selected when the amplitude of the received RF signal is high.

If the bypass mode is selected, a capacitance is coupled in series with the matching inductor in step 606. This may be accomplished by closing a switch coupled in parallel with a capacitor, or by turning off a transistor and relying on the capacitive parasitics of the transistor to provide the series capacitance. In step 608, the RF signal is provided to an output terminal via the bypass switch. During the bypass mode, steps 602, 604, 606 and 608 may run concurrently.

If the LNA mode is selected, the capacitance coupled in series with the matching inductor is bypassed, for example, but closing the switch and/or turning off the transistor mentioned above with respect to step 606. In step 612, the received RF is amplified using the LNA, and in step 614, the amplified RF signal is provided to the output terminal via the bypass switch. During the LNA mode, steps 602, 610, 612 and 614 may run concurrently.

Example embodiments of the present invention are summarized here. Other embodiments can also be understood from the entirety of the specification and the claims filed herein.

Example 1

A radio frequency (RF) amplifier circuit including: a switchable capacitance circuit having a first terminal configured to be coupled to an input matching inductor, the switchable capacitance circuit configured to: provide a short circuit between the first terminal and a second terminal in a first state, and provide a first capacitive impedance between the first terminal and the second terminal in a second state; a low noise amplifier (LNA) having an input terminal coupled to the second terminal of the switchable capacitance circuit; and a bypass switch having a first input terminal coupled to an output of the LNA, a second input terminal coupled to the second terminal of the switchable capacitance circuit, and an output terminal coupled to an output of the RF amplifier circuit, the bypass switch configured to select the output of LNA in the first state, and select the second terminal of the switchable capacitance circuit in the second state.

Example 2

The RF amplifier of example 1, where the switchable capacitance circuit includes a capacitor coupled in parallel with a switch.

Example 3

The RF amplifier of example 1, where the switchable capacitance circuit includes a transistor configured to be on in the first state and off in the second state, where parasitic capacitances of the transistor provide the first capacitive impedance in the second state.

Example 4

The RF amplifier of one of examples 1-3, where the bypass switch includes: a first switch coupled between the output of the LNA and the output of the RF amplifier circuit; a second switch coupled between the second terminal of the switchable capacitance circuit and the output of the RF amplifier circuit; and a T-switch coupled between the second terminal of the switchable capacitance circuit and the second switch.

Example 5

The RF amplifier of example 4, further including a matching network coupled between the T-switch and the second switch.

Example 6

The RF amplifier of one of examples 1-5, further including the matching inductor.

Example 7

The RF amplifier of one of examples 1-6, where the switchable capacitance circuit, the LNA and the bypass switch are disposed on a single semiconductor substrate.

Example 8

The RF amplifier of one of examples 1-7, where the first capacitive impedance is configured to provide an RF match in the second state.

Example 9

The RF amplifier of one of examples 1-8, where the LNA is configured to be turned-off in the second state.

Example 10

A radio frequency (RF) system including: an integrated circuit including a low noise amplifier (LNA), a first transistor having a load path coupled between an input of the LNA and an input pad of the integrated circuit, the load path having a low impedance when the integrated circuit is in a first state and a first capacitive impedance when the integrated circuit is in a second state, where the first capacitance impedance is configured to provide an RF match when the integrated circuit is in the second state, a first switch coupled between an output of the LNA and an output pad of the integrated circuit, the first switch configured to be on when the integrated circuit is in the first state and off when the integrated circuit is in the second state, a second switch coupled between the input of the LNA and the output pad of the integrated circuit, the second switch configured to be off when the integrated circuit is in the first state and on when the integrated circuit is in the second state.

Example 11

The RF system of example 10, further including a matching inductor having a first terminal coupled to the input pad of the integrated circuit.

Example 12

The RF system of example 10, where the integrated circuit further includes a third switch coupled between the second switch and the output pad of the LNA.

Example 13

The RF system of example 12, where the integrated circuit further includes a matching network coupled between the second switch and the third switch.

Example 14

The RF system of one of examples 12 or 13, where the second switch includes a T-switch.

Example 15

The RF system of one of examples 12-14, where the LNA includes: MOS transistor having a gate terminal coupled to the input of the LNA and a drain terminal coupled to the output of the LNA; a degeneration inductor coupled to a source terminal of the MOS transistor; and a cascode transistor coupled between the drain terminal of the MOS transistor and the output of the LNA.

Example 16

A method of operating an LNA, the method including bypassing the LNA including receiving an RF signal via an input matching inductor, coupling a first capacitance in series with the input matching inductor, and providing the received RF signal to an output terminal via a bypass switch having a first input connected to the input of the LNA and an output coupled to the output terminal. The method also includes operating the LNA including receiving the RF signal via an input matching inductor, bypassing the first capacitance, amplifying the RF signal using the LNA, and providing the amplified RF signal to the output terminal via the bypass switch having a second input connected to the output of the LNA and an output coupled to the output terminal.

Example 17

The method of example 16, where: bypassing the LNA further includes powering down the LNA; and operating the LNA further includes powering up the LNA.

Example 18

The method of example 16 or 17, where: bypassing the first capacitance includes turning on a switch coupled in parallel with a capacitor; and coupling the first capacitance includes turning off the switch coupled in parallel with the capacitor.

Example 19

The method of one of examples 16-18, where: the switch includes an MOS transistor; and the capacitor includes a parasitic gate-drain and parasitic gate source capacitance of the MOS transistor.

Example 20

The method of one of examples 16-19, where the first capacitance and the input matching inductor are configured to provide an RF match when bypassing the LNA.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency (RF) amplifier circuit comprising:
    a switchable capacitance circuit having a first terminal configured to be coupled to an input matching inductor, the switchable capacitance circuit configured to:
        provide a short circuit between the first terminal and a second terminal in a first state, and
        provide a first capacitive impedance between the first terminal and the second terminal in a second state;
    a low noise amplifier (LNA) having an input terminal coupled to the second terminal of the switchable capacitance circuit; and
    a bypass switch having a first input terminal coupled to an output of the LNA, a second input terminal coupled to the second terminal of the switchable capacitance circuit, and an output terminal coupled to an output of the RF amplifier circuit, the bypass switch configured to select the output of LNA in the first state, and select the second terminal of the switchable capacitance circuit in the second state.

2. The RF amplifier of claim 1, wherein the switchable capacitance circuit comprises a capacitor coupled in parallel with a switch.

3. The RF amplifier of claim 1, wherein the switchable capacitance circuit comprises a transistor configured to be on in the first state and off in the second state, wherein parasitic capacitances of the transistor provide the first capacitive impedance in the second state.

4. The RF amplifier of claim 1, wherein the bypass switch comprises:
    a first switch coupled between the output of the LNA and the output of the RF amplifier circuit;
    a second switch coupled between the second terminal of the switchable capacitance circuit and the output of the RF amplifier circuit; and
    a T-switch coupled between the second terminal of the switchable capacitance circuit and the second switch.

5. The RF amplifier of claim 4, further comprising a matching network coupled between the T-switch and the second switch.

6. The RF amplifier of claim 1, further comprising the matching inductor.

7. The RF amplifier of claim 1, wherein the switchable capacitance circuit, the LNA and the bypass switch are disposed on a single semiconductor substrate.

8. The RF amplifier of claim 1, wherein the first capacitive impedance is configured to provide an RF match in the second state.

9. The RF amplifier of claim 1, wherein the LNA is configured to be turned-off in the second state.

* * * * *